United States Patent
Pi et al.

(10) Patent No.: US 11,873,554 B2
(45) Date of Patent: Jan. 16, 2024

(54) ION IMPLANTATION TO MODIFY GLASS LOCALLY FOR OPTICAL DEVICES

(71) Applicant: Applied Materials, Inc., Santa Clara, CA (US)

(72) Inventors: Nai-Wen Pi, San Jose, CA (US); Jinxin Fu, Fremont, CA (US); Kang Luo, Santa Clara, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/655,849

(22) Filed: Mar. 22, 2022

(65) Prior Publication Data

US 2022/0307127 A1  Sep. 29, 2022

Related U.S. Application Data

(60) Provisional application No. 63/165,958, filed on Mar. 25, 2021.

(51) Int. Cl.
| | |
|---|---|
| *C23C 14/48* | (2006.01) |
| *C23C 14/02* | (2006.01) |
| *C23C 14/00* | (2006.01) |
| *C03C 23/00* | (2006.01) |
| *C23C 14/58* | (2006.01) |
| *G02B 6/10* | (2006.01) |

(52) U.S. Cl.
CPC .......... *C23C 14/48* (2013.01); *C03C 23/0095* (2013.01); *C23C 14/0031* (2013.01); *C23C 14/021* (2013.01); *C23C 14/5873* (2013.01); *G02B 6/10* (2013.01)

(58) Field of Classification Search
CPC ... C23C 14/48; C23C 14/0031; C23C 14/021; C23C 14/5873; C03C 23/0095; G02B 6/10
See application file for complete search history.

(56) References Cited

U.S. PATENT DOCUMENTS

| | | |
|---|---|---|
| 2014/0321806 A1 | 10/2014 | Lee |
| 2018/0095201 A1 | 4/2018 | Melli et al. |
| 2020/0301048 A1* | 9/2020 | Goeckeritz ........... C03C 21/002 |
| 2020/0326621 A1 | 10/2020 | Godet et al. |

FOREIGN PATENT DOCUMENTS

CN  110456435 A  11/2019

OTHER PUBLICATIONS

International Search Report/ Written Opinion issued to PCT/US2022/021399 dated Jul. 8, 2022.

* cited by examiner

*Primary Examiner* — Hai Y Zhang
(74) *Attorney, Agent, or Firm* — Patterson + Sheridan, LLP

(57) ABSTRACT

Embodiments described herein provide for optical devices with methods of forming optical device substrates having at least one area of increased refractive index or scratch resistance. One method includes disposing an etch material on a discrete area of an optical device substrate or an optical device layer, disposing a diffusion material in the discrete area, and removing excess diffusion material to form an optical material in the optical device substrate or the optical device layer having a refractive index greater than or equal to 2.0 or a hardness greater than or equal to 5.5 Mohs.

11 Claims, 3 Drawing Sheets

ION IMPLANTATION TO MODIFY GLASS LOCALLY FOR OPTICAL DEVICES

CROSS-REFERENCE TO RELATED APPLICATIONS

This application claims priority to U.S. Provisional Patent Application Ser. No. 63/165,958, filed on Mar. 25, 2021, which herein is incorporated by reference.

BACKGROUND

Field

Embodiments of the present disclosure generally relate to optical devices for augmented, virtual, and mixed reality. More specifically, embodiments described herein provide for methods of forming discrete regions of optical device substrates having at least one discrete area of high refractive index or scratch resistant optical material.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated to appear as part of the environment. Augmented reality can include any type of input, such as audio and haptic inputs, as well as virtual images, graphics, and video that enhance or augment the environment that the user experiences. As an emerging technology, there are many challenges and design constraints with augmented reality.

One such challenge is displaying a virtual image overlaid on an ambient environment. Optical devices including waveguide combiners, such as augmented reality waveguide combiners, and flat optical devices, such as metasurfaces, are used to assist in overlaying images. Generated light is propagated through an optical device until the light exits the optical device and is overlaid on the ambient environment. Optical devices include optical device structures disposed on a glass substrate. The optical devices may benefit from optical device structures having at least one of a high refractive index, i.e. a refractive index great than about 2.0, or scratch resistance.

Accordingly, what is needed in the art are methods of forming optical device substrates having at least one discrete area of high refractive index or scratch resistant optical material.

SUMMARY

In one embodiment, a method is provided. The method includes disposing an etch material on a discrete area of an optical device substrate or an optical device layer, disposing a diffusion material in the discrete area, and removing excess diffusion material to form an optical material in the optical device substrate or the optical device layer having a refractive index greater than or equal to 2.0 or a hardness greater than or equal to 5.5 Mohs.

In another embodiment, a method is provided. The method includes performing an implantation process on a discrete area of an optical device substrate or an optical device layer and removing excess implanted material to form an optical material in the optical device substrate or the optical device layer having a refractive index greater than or equal to 2.0 or a hardness greater than or equal to 5.5 Mohs.

In yet another embodiment, a method is provided. The method includes performing a laser doping process on a discrete area of an optical device substrate or an optical device layer and removing excess doped material to form an optical material in the optical device substrate or the optical device layer having a refractive index greater than or equal to 2.0 or a hardness greater than or equal to 5.5 Mohs.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optical devices for augmented, virtual, and mixed reality. More specifically, embodiments described herein provide for optical devices with methods of forming optical device substrates having at least one area of increased refractive index or scratch resistance.

In one embodiment, a method is provided. The method includes disposing an etch material on a discrete area of an optical device substrate or an optical device layer, disposing a diffusion material in the discrete area, and removing excess diffusion material to form an optical material in the optical device substrate or the optical device layer having a refractive index greater than or equal to 2.0 or a hardness greater than or equal to 5.5 Mohs.

In another embodiment, a method is provided. The method includes performing an implantation process on a discrete area of an optical device substrate or an optical device layer and removing excess implanted material to form an optical material in the optical device substrate or the optical device layer having a refractive index greater than or equal to 2.0 or a hardness greater than or equal to 5.5 Mohs.

In yet another embodiment, a method is provided. The method includes performing a laser doping process on a discrete area of an optical device substrate or an optical device layer and removing excess doped material to form an optical material in the optical device substrate or the optical device layer having a refractive index greater than or equal to 2.0 or a hardness greater than or equal to 5.5 Mohs.

Figure 1A:
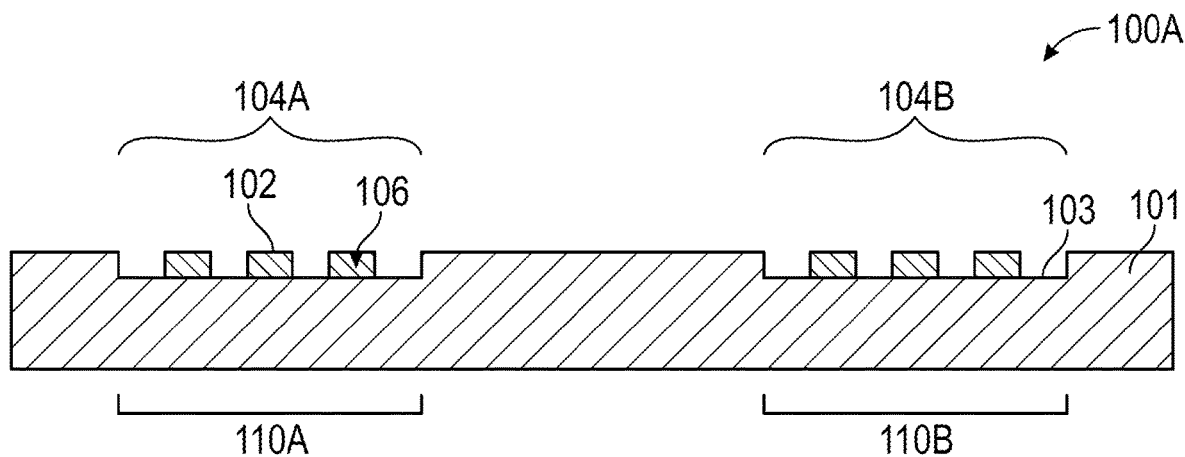
FIGS. 1A-1C are schematic, cross-sectional views of an optical device according to embodiments.
Figure 1B:
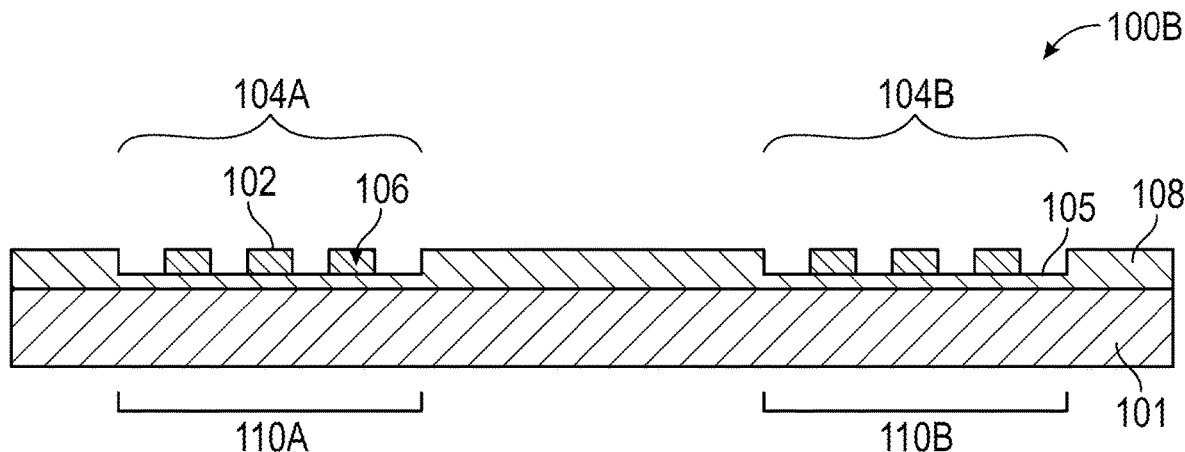
Figure 1C:
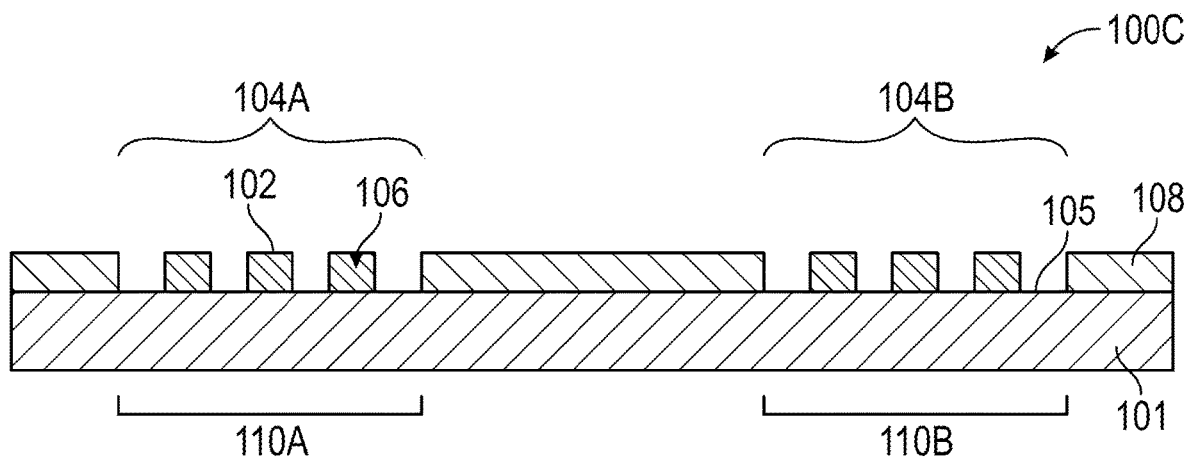

FIGS. 1A-1C are schematic, cross-sectional views of optical devices 100A, 100B, 100C. It is to be understood that the optical devices 100A, 100B, 100C described herein are exemplary optical devices. The substrate 101 may be formed from any suitable material, provided that the substrate 101 can adequately transmit light in a desired wavelength or wavelength range and can serve as an adequate support for the optical devices 100A, 100B, 100C described herein. The material of the substrate 101 has a refractive index that is lower than the refractive index of a plurality of optical device structures 102. Substrate selection may include substrates of any suitable material, including, but not limited to, amorphous dielectrics, non-amorphous dielectrics, crystalline dielectrics, silicon-containing materials, polymers, and combinations thereof. In one embodiment, which can be combined with other embodiments described herein, the substrate 101 consists of one or more of silicon (Si), silicon dioxide ($SiO_2$), silicon carbide (SiC), fused silica, diamond, or quartz materials. In another embodiment, which can be combined with other embodiments described herein, the substrate 101 consists of one or more of nitrogen, titanium, niobium, lanthanum, zirconium, or yttrium containing-materials.

The optical devices 100A, 100B, 100C are a waveguide combiners, such as augmented reality waveguide combiners. The optical devices 100A, 100B, 100C include at least one grating 104A, 104B of a plurality of optical device structures 102 formed from at least one discrete area 110A, 110B area of an optical material 106. The optical material 106 of the optical device 100A is formed on the substrate 101 according to one of the methods 200 or 300 described herein. The optical material 106 of the optical devices 100B, 100C are formed from a device layer 108 according to one of the methods 200 or 300 described herein. The plurality of optical device structures 102 of the optical device 100B contact an upper surface 105 of the device layer 108. The plurality of optical device structures 102 of the optical device 100C contact an upper surface 103 of the substrate 101. The plurality of optical device structures 102 are nanostructures having sub-micron dimensions, e.g., nano-sized dimensions.

The device layer 108 includes, but is not limited to, one or more of silicon carbide (SiC), silicon oxycarbide (SiOC), titanium dioxide ($TiO_2$), silicon dioxide ($SiO_2$), vanadium (IV) oxide (VOx), aluminum oxide ($Al_2O_3$), aluminum-doped zinc oxide (AZO), indium tin oxide (ITO), tin dioxide ($SnO_2$), zinc oxide (ZnO), tantalum pentoxide ($Ta_2O_5$), silicon nitride ($Si_3N_4$), zirconium dioxide ($ZrO_2$), niobium oxide ($Nb_2O_5$), cadmium stannate ($Cd_2SnO_4$), silicon mononitride (SiN), silicon oxynitride (SiON), barium titanate ($BaTiO_3$), diamond like carbon (DLC), hafnium(IV) oxide ($HfO_2$), lithium niobate ($LiNbO_3$), or silicon carbon-nitride (SiCN) containing materials.

The optical material 106 has one of a refractive index greater than or equal to 2.0, i.e., a high refractive index, or a hardness greater than or equal to 5.5 Mohs. In one example, the optical material 106 has a refractive index of 2.91. In another example, the optical material 106 has a hardness of 7.0 Mohs. The optical material 106 having the high refractive index includes nitrides or carbides of the material of the substrate 101 or the material of the device layer 108. The optical material 106 having the hardness includes aluminum, potassium, or carbon containing compounds of the material of the substrate 101 or the material of the device layer 108.

Figure 2:
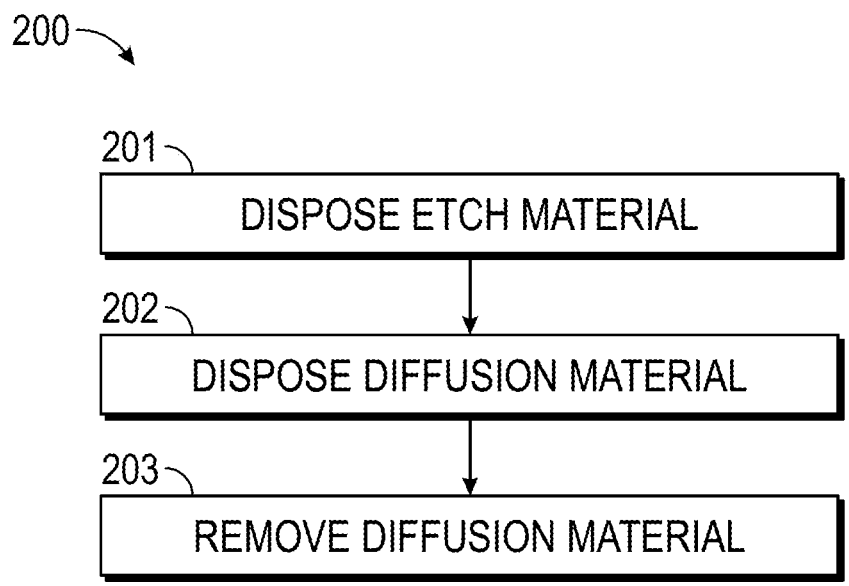
FIG. 2 is a flow diagram of a method for forming an optical device substrate according to embodiments.

FIG. 2 is a flow diagram of a method 200 a forming an optical device substrate 101 having at least one discrete area 110 of high refractive index or scratch resistant optical material 106, as shown in FIGS. 4A-4E. FIGS. 4A-4E are schematic, cross-sectional views of a substrate 101. While aspects of method 200 for forming the discrete area 110 of the optical material 106 in the substrate 101 are discussed, it is to be understood that the discrete area 110 of the optical material 106 in the device layer 108 of the substrate 101 is formed according to method 200 described herein.

Figure 4A:
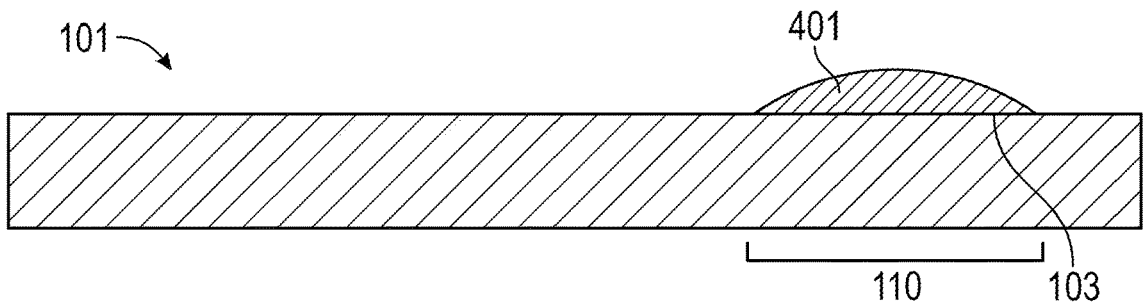
FIGS. 4A-4E are schematic, cross-sectional views of a substrate according to embodiments.
Figure 4B:
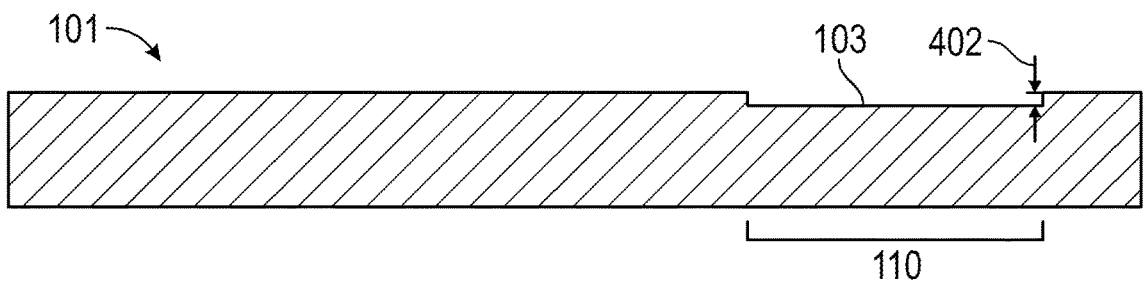
Figure 4C:
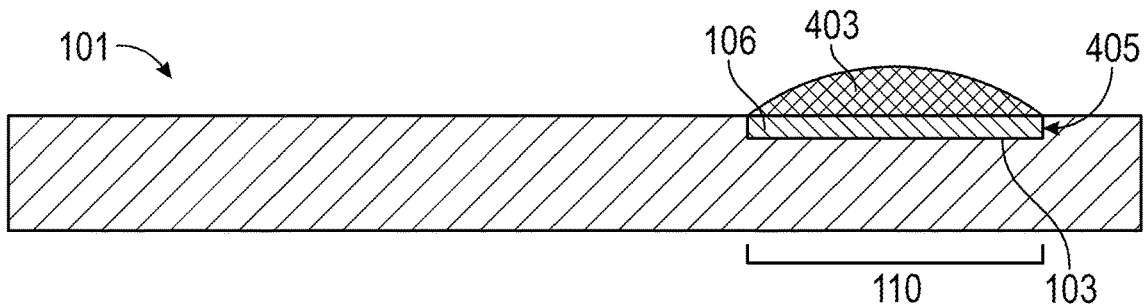

At operation 201, as shown in FIG. 4A, an etch material 401 (e.g., etchant) is disposed on a discrete area 110 of the substrate 101 or the device layer 108. The device layer 108 is disposed on the substrate by chemical vapor deposition, spin on coating, inkjet printing, or physical vapor deposition. While FIGS. 4A-4C depict the upper surface 103 of the substrate 101, as described herein the method 200 is applicable to the upper surface 105 of the device layer 108. The etch material 401 may be dispensed on the upper surface 103 or the upper surface 105 of the device layer 108 of the discrete area 110 via inkjet dispensing. In one example, the etch material 401 includes at least one of ammonium hydrogen fluoride ($NH_4HF_2$) or hydrogen chloride (HCl). In another example, the etch material 401 includes at least one of ammonium hydroxide ($NH_4OH$) or hydrogen peroxide ($H_2O_2$). As shown in FIG. 4B, the etch material 401 forms a depth 402 and porosities in the discrete area 110. At operation 202, as shown in FIG. 4C, a diffusion material 403 is disposed in the depth 402 of the discrete area 110. The diffusion material 403 may be dispensed on the upper surface 103 or the upper surface 105 of the device layer 108 of the discrete area 110 via inkjet dispensing. The diffusion material 403 includes nitrogen, carbon, aluminum, or potassium containing materials. Ions 405 of the diffusion material 403 diffuse into the porosities of the substrate 101 or the device layer 108 and bond with the substrate 101 or the device layer 108 to form the optical material 106.

Figure 4D:
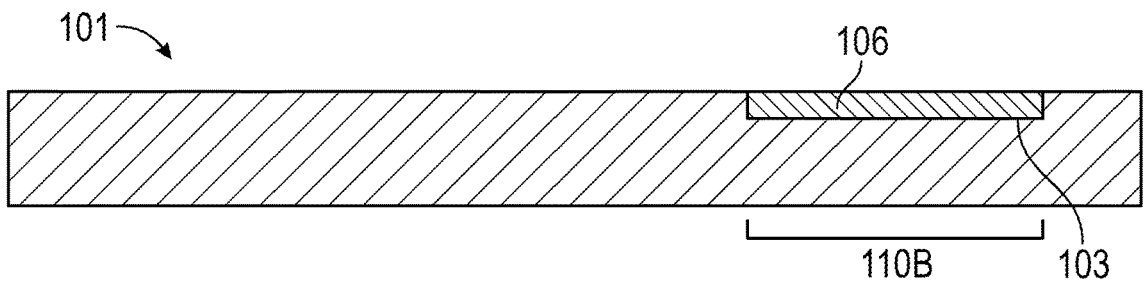

The optical material 106 of the embodiments of FIG. 4D formed from the method 200, includes, one or more of Si, $SiO_2$, SiC, fused silica, quartz, nitrogen, titanium, niobium, lanthanum, zirconium, or yttrium containing-materials with nitrogen, carbon, aluminum, or potassium containing materials disposed in the porosities of the substrate 101. The optical material 106 of the embodiments of FIG. 4E formed from the method 200, includes, one or more of SiC, SiOC, $TiO_2$, $SiO_2$, VOx, $Al_2O_3$, AZO, ITO, $SnO_2$, ZnO, $Ta_2O_5$, $Si_3N_4$, $ZrO_2$, $Nb_2O_5$, $Cd_2SnO_4$, SiN, SiON, $BaTiO_3$, DLC, $HfO_2$, $LiNbO_3$, or SiCN containing materials with nitrogen, carbon, aluminum, or potassium containing materials disposed in the porosities of the optical material 106.

Figure 4E:
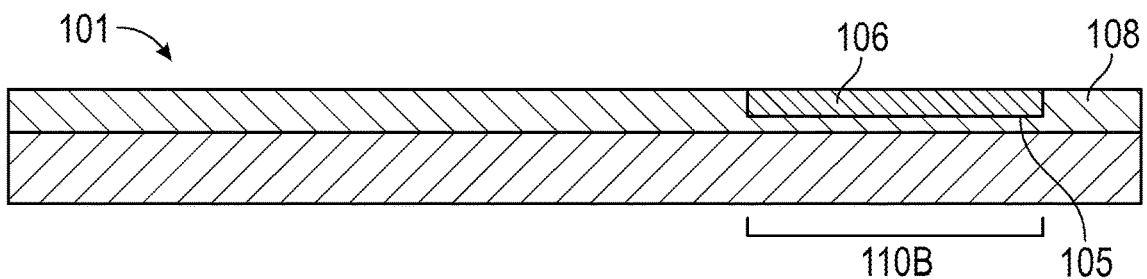

At operation 203, as shown in FIGS. 4D and 4E, excess diffusion material 403 is removed such that the substrate 101 is planar. The excess diffusion material 403 may be removed by polishing. The discrete area 110 corresponds to one of the discrete area 110B of the optical device 100A, 1100B, and 100C. The method may be repeated to form the discrete area 110A of the optical material 106. The substrate 101 formed by the method 200 may be etched to form a plurality of optical device structures 102.

Figure 3:
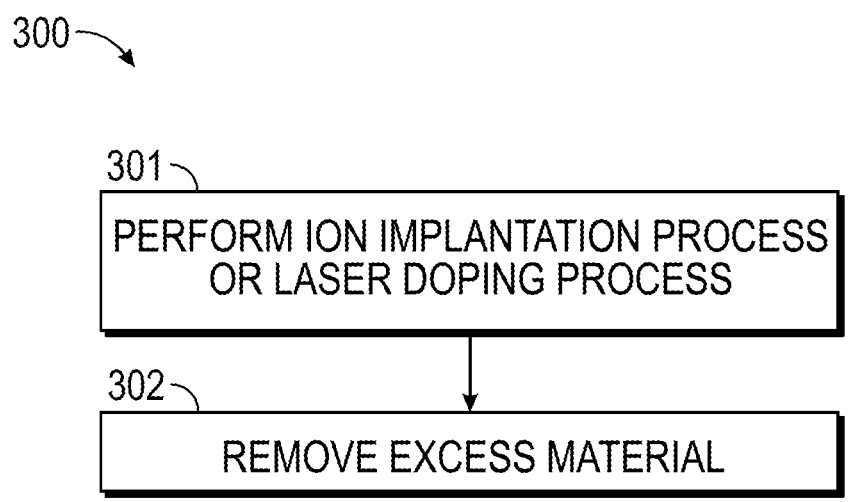
FIG. 3 is a flow diagram of a method for forming an optical device substrate according to embodiments.

FIG. 3 is a flow diagram of a method 300 for forming an optical device substrate 101 having at least one discrete area 110 of high refractive index or scratch resistant optical material 106, as shown in FIGS. 4C-4E. While aspects of method 300 for forming the discrete area 110 of the optical material 106 in the substrate 101 are discussed, it is to be understood that the discrete area 110 of the optical material 106 in the device layer 108 of the substrate 101 is formed according to method 300 described herein. While FIG. 4C depicts the upper surface 103 of the substrate 101, as described herein the method 300 is applicable to the upper surface 105 of the device layer 108.

At operation 301, as shown in FIG. 4C, one of an ion implantation process or a laser doping process is performed on a discrete area 110 of the substrate 101 or the device layer 108. In the ion implantation process, the diffusion material 403, i.e., ions of an implantation gas are accelerated to the substrate 101 or the device layer 108. The ions 405 of the implantation gas diffuse into the substrate 101 or the device layer 108 and bond with the substrate 101 or the device layer 108 to form the optical material 106. The implantation forms an optical material 106 of ZnO, $ZrO_2$, or $TiO_2$. In the laser doping process ions of a heat spot are generated on the discrete area 110. The ions 405 of a reactive gas bond with the substrate 101 or the device layer 108 to form the optical material 106. The reactive gas includes carbon or nitrogen. The reactive gas including nitrogen forms an optical material 106 of SiON or SiN. The reactive gas including nitrogen forms an optical material 106 of SiC.

At operation 302, as shown in FIGS. 4D and 4E, excess diffusion material 403 is removed such that the substrate 101 is planar. The excess diffusion material 403 may be removed by polishing. The discrete area 110 corresponds to one of the discrete area 110B of the optical devices 100A, 1100B, and 100C. The method may be repeated to form the discrete area 110A of the optical material 106. The substrate 101 formed by the method 300 may be etched to form a plurality of optical device structures 102.

The optical material 106 has one of a refractive index greater than or equal to 2.0, i.e., a high refractive index, or a hardness greater than or equal to 5.5 Mohs. The optical material 106 with the refractive index greater than or equal to 2.0 includes $TiO_2$, $Ta_2O_5$, $Si_3N_4$, $Nb_2O_5$, SiN, SiC, $HfO_2$, or $LiNbO_3$ containing materials with nitrogen, carbon, aluminum, or potassium containing materials disposed in the porosities of the optical material 106. The optical material 106 a hardness of 7.0 Mohs includes diamond or SiC. After one of the method 200 for the method 300 for forming the optical device substrate 101 having at least one discrete area 110 of high refractive index or scratch resistant optical material 106, the at least one discrete area 110 is etched to form the plurality of optical device structures 102 as shown and described in FIGS. 1A-1C.

In summation, methods for forming an optical device substrate having at least one discrete area of high refractive index or scratch resistant material are described herein. While the foregoing is directed to examples of the present disclosure, other and further examples of the disclosure may be devised without departing from the basic scope thereof, and the scope thereof is determined by the claims that follow.

What is claimed is:

1. A method, comprising:
    disposing an etch material on a discrete area of an optical device substrate or an optical device layer, the etch material forming a depth in the discrete area;
    disposing a diffusion material in the depth of the discrete area, wherein ions of the diffusion material diffuse into porosities of the optical device substrate or the optical device layer and bond with the optical device substrate or the optical device layer to form an optical material; and
    removing excess diffusion material, the optical material having a refractive index greater than or equal to 2.0 or a hardness greater than or equal to 5.5 Mohs.

2. The method of claim 1, wherein the optical device substrate consists of one or more of silicon (Si), silicon carbide (SiC), silicon dioxide ($SiO_2$), fused silica, diamond, or quartz materials.

3. The method of claim 2, wherein the optical material comprises nitrides or carbides of the material of the optical device substrate or the optical device layer.

4. The method of claim 2, wherein the optical material comprises aluminum, potassium, or carbon containing compounds of the material of the optical device substrate or the optical device layer.

5. The method of claim 1, wherein the optical device substrate consists of one or more of nitrogen, titanium, niobium, lanthanum, zirconium, or yttrium containing-materials.

6. The method of claim 5, wherein the optical material comprises nitrides or carbides of the material of the optical device substrate or the optical device layer.

7. The method of claim 5, wherein the optical material comprises aluminum, potassium, or carbon containing compounds of the material of the optical device substrate or the optical device layer.

8. The method of claim 1, wherein the etch material is dispensed on the discrete area via inkjet dispensing.

9. The method of claim 1, wherein the diffusion material is dispensed on the discrete area via inkjet dispensing.

10. The method of claim 1, wherein the etch material comprises ammonium hydrogen fluoride ($NH_4HF_2$), hydrogen chloride (HCl), ammonium hydroxide ($NH_4OH$), hydrogen peroxide ($H_2O_2$), or combinations thereof.

11. The method of claim 1, the optical device layer comprises one or more of silicon carbide (SiC), silicon oxycarbide (SiOC), titanium dioxide ($TiO_2$), silicon dioxide ($SiO_2$), vanadium (IV) oxide (VOx), aluminum oxide ($Al_2O_3$), aluminum-doped zinc oxide (AZO), indium tin oxide (ITO), tin dioxide ($SnO_2$), zinc oxide (ZnO), tantalum pentoxide ($Ta_2O_5$), silicon nitride ($Si_3N_4$), zirconium dioxide ($ZrO_2$), niobium oxide ($Nb_2O_5$), cadmium stannate ($Cd_2SnO_4$), silicon mononitride (SiN), silicon oxynitride (SiON), barium titanate ($BaTiO_3$), diamond like carbon (DLC), hafnium(IV) oxide ($HfO_2$), lithium niobate ($LiNbO_3$), or silicon carbon-nitride (SiCN) containing materials.

* * * * *